(12) United States Patent
Ge et al.

(10) Patent No.: US 11,515,238 B2
(45) Date of Patent: Nov. 29, 2022

(54) POWER DIE PACKAGE

(71) Applicant: NXP USA, INC., Austin, TX (US)

(72) Inventors: You Ge, Tianjin (CN); Meng Kong Lye, Shah Alam (MY); Zhijie Wang, Tianjin (CN); Kabir Mirpuri, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 1 day.

(21) Appl. No.: 16/903,496

(22) Filed: Jun. 17, 2020

(65) Prior Publication Data

US 2020/0411423 A1 Dec. 31, 2020

(30) Foreign Application Priority Data

Jun. 27, 2019 (CN) .......................... 201910566612.X

(51) Int. Cl.
| | |
|---|---|
| *H01L 23/495* | (2006.01) |
| *H01L 21/56* | (2006.01) |
| *H01L 23/00* | (2006.01) |
| *H01L 25/00* | (2006.01) |
| *H01L 23/31* | (2006.01) |

(52) U.S. Cl.
CPC ...... *H01L 23/49575* (2013.01); *H01L 21/568* (2013.01); *H01L 23/49513* (2013.01); *H01L 23/49555* (2013.01); *H01L 24/32* (2013.01); *H01L 24/48* (2013.01); *H01L 24/49* (2013.01); *H01L 24/73* (2013.01); *H01L 24/92* (2013.01); *H01L 25/50* (2013.01); *H01L 23/3135* (2013.01); *H01L 23/3185* (2013.01); *H01L 2224/32245* (2013.01); *H01L 2224/48145* (2013.01); *H01L 2224/48175* (2013.01); *H01L 2224/73215* (2013.01); *H01L 2224/73265* (2013.01); *H01L 2224/92147* (2013.01); *H01L 2224/92247* (2013.01)

(58) Field of Classification Search
CPC ..... H01L 2224/48091; H01L 23/49524; H01L 24/49; H01L 23/49575; H01L 24/73; H01L 2224/32245; H01L 23/49555; H01L 24/92; H01L 24/32; H01L 23/4951; H01L 23/49562; H01L 2224/48145; H01L 23/49503; H01L 25/50
See application file for complete search history.

(56) References Cited

U.S. PATENT DOCUMENTS

| | | | |
|---|---|---|---|
| 6,117,710 A | 9/2000 | Mostafazadeh et al. | |
| 6,137,165 A | 10/2000 | Thierry | |
| 6,376,914 B2 | 4/2002 | Kovats | |
| 6,717,260 B2 | 4/2004 | Pavier et al. | |
| 7,061,080 B2 | 6/2006 | Jeun et al. | |
| 7,335,532 B2* | 2/2008 | Noquil | ................ H01L 23/3128 |
| | | | 257/E21.503 |
| 8,546,955 B1 | 10/2013 | Wu | |

(Continued)

*Primary Examiner* — Jasmine J Clark

(57) ABSTRACT

A power die package includes a lead frame having a flag with power leads on one lateral side and signal leads on one or more other lateral sides. A power die is attached to a bottom surface of the flag and electrically connected to the power leads with a conductive epoxy. A control die is attached to a top surface of the flag and electrically connected to the signal leads with bond wires. A mold compound is provided that encapsulates the dies, the bond wires, and proximal parts of the leads, while distal ends of the leads are exposed, forming a PQFN package.

20 Claims, 7 Drawing Sheets

(56) References Cited

U.S. PATENT DOCUMENTS

| | | |
|---|---|---|
| 9,214,416 B1 | 12/2015 | Furnival |
| 9,263,299 B2 | 2/2016 | Van Gemert et al. |
| 9,449,957 B2 | 9/2016 | Fernando et al. |
| 9,613,941 B2 | 4/2017 | Xu et al. |
| 9,685,396 B2 | 6/2017 | Navaya |
| 2002/0149103 A1 | 10/2002 | Yang et al. |
| 2009/0189266 A1 | 7/2009 | Liu et al. |
| 2011/0096509 A1 | 4/2011 | Yoshimochi |
| 2012/0228696 A1 | 9/2012 | Carpenter et al. |
| 2013/0181332 A1 | 7/2013 | Kelkar et al. |
| 2014/0264804 A1 | 9/2014 | Terrill et al. |
| 2018/0012877 A1 | 1/2018 | Beyer et al. |

* cited by examiner

POWER DIE PACKAGE

CROSS-REFERENCE TO RELATED APPLICATIONS

This application claims the priority under 35 U.S.C. § 119 of China application no. 201910566612.X, filed on 27 Jun. 2019, the contents of which are incorporated by reference herein.

BACKGROUND

The present invention relates to integrated circuit (IC) packaging, and, more particularly, to a power die package.

FIG. 1 is a cross-sectional side view of a conventional power die package 10, which is assembled using a lead frame having a flag 12 and leads 14 that surround the flag 12. A power die 16 is attached to a top surface of the flag 12 with a lead free die attach adhesive 18 and a control die 20 is attached to a top surface of the power die 18 with an adhesive film 22. The power die 16 is electrically connected to a first set of the leads 14 with thick aluminum bond wires 24 (e.g., 15 mil diameter), while the control die 20 is electrically connected to a second set of the leads 14 with thin copper bond wires 26 (e.g., 1.5 mil diameter). The entire assembly is covered with an encapsulant 28. The encapsulant 28 is provided to protect the dies 16 and 20 and the wire bonds from being damaged.

The power die 16 generates heat that must be dissipated, so the flag 12 is formed of a relatively thick sheet of copper and the die attach adhesive must have good thermal properties, which factors increase the overall cost of the package 10. It would be advantageous to reduce the assembly cost of such power die packages.

BRIEF DESCRIPTION OF THE DRAWINGS

Aspects, features, and advantages of the invention will become fully apparent from the following detailed description, the appended claims, and the accompanying drawings in which like reference numerals identify similar or identical elements. Certain elements shown in the drawing may exaggerated, and thus not drawn to scale, in order to more clearly present the invention

DETAILED DESCRIPTION

Figure 1:
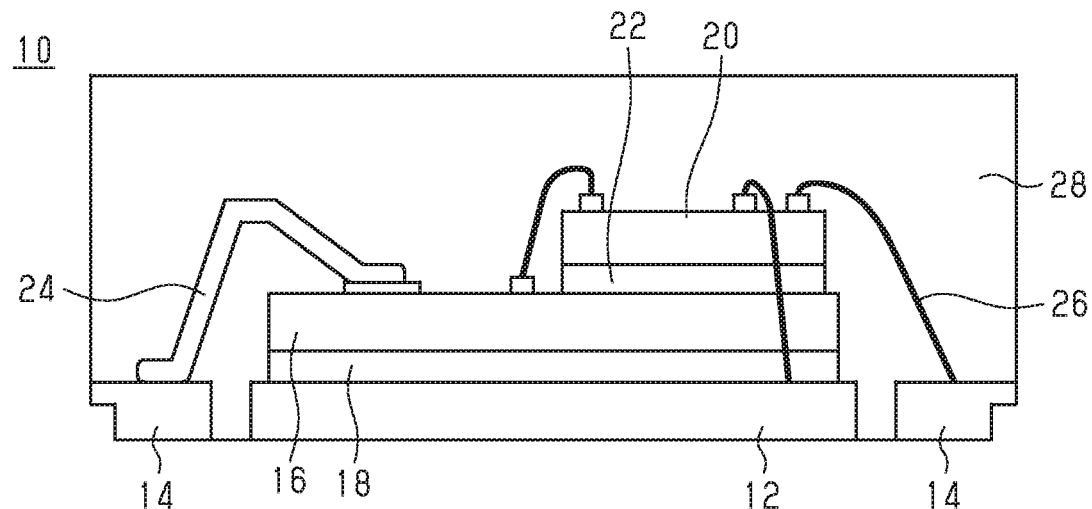
FIG. 1 is an enlarged cross-sectional side view of a conventional power die package.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, the present invention provides a power die package comprising a lead frame, a control die and a power die. The lead frame includes a flag having a top or upper surface for receiving the control die and a bottom or lower surface for receiving the power die. The lead frame also has a plurality of power leads adjacent to and spaced from a first lateral side of the flag and a plurality of signal leads adjacent to and spaced from at least one other lateral side of the flag. The power leads have proximal ends near to the flag and distal ends spaced further from the flag. The control die has a back side attached to the upper surface of the flag and an active side opposite to the back side that includes a plurality of control die electrodes. A first set of the control die electrodes are electrically connected to the plurality of signal leads with first bond wires. The power die has a first side attached to the lower surface of the flag. The power die has a plurality of power die electrodes including a first set of power die electrodes that are electrically connected to the plurality of power leads. In other embodiments, a second set of the control die electrodes are connected to a second set of the power die electrodes with second bond wires, and the entire assembly is covered with a mold compound.

The present invention also provides a method of assembling a power die package, including providing a lead frame having a flag with a top or upper surface for receiving a control die and a bottom or lower surface for receiving a power die. The lead frame also has a plurality of power leads adjacent to and spaced from a first lateral side of the flag and a plurality of signal leads adjacent to and spaced from at least one other lateral side of the flag. The power leads have proximal ends near to the flag and distal ends spaced further from the flag. An active side of a power die is attached to the lower surface of the flag. The power die has a larger footprint than the flag such that a portion of the power die overhangs the flag, and the portion of the power die that overhangs the flag has a plurality of power die electrodes including a first set of power die electrodes that are in contact with and electrical communication with the proximal ends of the power leads. A back side of a control die is attached to the upper surface of the flag. An active side of the control die, opposite the back side of the flag, includes a plurality of control die electrodes. A first set of the control die electrodes is electrically connected to the plurality of signal leads with first bond wires, and then the flag, the proximal ends of the power leads, the signal leads, the control die, the power die, the electrical connections between the power leads and the first set of power die electrodes, and the first bond wires are encased with a mold compound, where a bottom surface of the power die is exposed.

The present invention provides a lower cost power die package than presently available packages because the lead frame is less expensive and thick Aluminum bond wires are not needed. In addition, the cost of attaching the power die to the flag is less because either a lower cost die attach material may be used or less of a more expensive die attach material is required because the entire bottom surface of the power die is not attached to the flag. The package of the present invention also may have better thermal properties than the conventional power die package because the bottom side of the power die is exposed.

Figure 2:
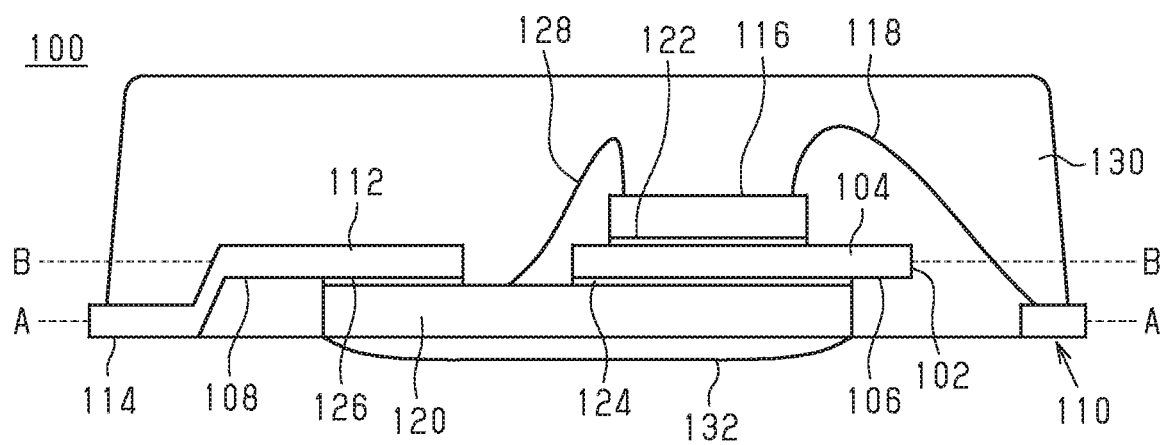
FIG. 2 is an enlarged cross-sectional side view of a power die package in accordance with an embodiment of the present invention.

Referring now to FIG. 2, a cross-sectional side view of a power die package 100 in accordance with an embodiment of the present invention is shown. The power die package 100 includes a lead frame having a flag 102 having a top or upper surface 104 for receiving a control die and a bottom or lower surface 106 for receiving a power die. The lead frame also has a plurality of power leads 108 adjacent to and spaced from a first lateral side of the flag 102 and a plurality of signal leads 110 adjacent to and spaced from at least one other lateral side of the flag 102. The power leads 108 have proximal ends 112 near to the flag 102 and distal ends 114 spaced further from the flag 102.

A control die 116 has a back side that is attached to the upper surface 104 of the flag 102 and an active side, which is opposite to its back side, that includes a plurality of control die electrodes. A first set of the control die electrodes are electrically connected to the plurality of signal leads 110. In the presently preferred embodiment, the first plurality of control die electrodes are connected to the signal leads 110 with first bond wires 118. The first bond wires 118 may comprise copper, gold or other conductive metal wires, as is known in the art and connected to the die electrodes and the lead frame leads 110 using commercially available wire bonding equipment.

A power die 120 has a first or active side attached to the lower surface 106 of the flag 102. The power die 120 has a plurality of power die electrodes on its active side, including a first set of power die electrodes, that are electrically connected to the plurality of power leads 108. More particularly, in accordance with the presently preferred embodiment of the invention, the proximal ends 112 of the power leads 108 are in direct contact with the first set of power die electrodes.

The control die 116 is attached to the upper surface 104 of the die flag 102 with a die attach material 122, such as a die attach epoxy or a die attach adhesive tape, both of which are known in the art and commercially available. The power die 120 is attached to the lower surface 106 of the die flag 102 with a conductive epoxy 124. The proximal ends 112 of the power leads 108 are connected to the first set of power die electrodes also with a conductive epoxy 126. The conductive epoxies 124 and 126 preferably comprise the same material. The die attach material 122 can be conductive or non-conductive, while the epoxies 124 and 126 are conductive epoxies. Suitable conductive and non-conductive epoxies are known by those of skill in the art and readily commercially available.

As can be seen in FIG. 2, the signal leads 110 and the distal ends 114 of the power die leads 108 lie in a first plane A-A and the proximal ends 112 of the power die leads 108 and the flag 102 lie in a second plane B-B. The second plane B-B is parallel to and spaced from the first plane A-A, such that the proximal ends 112 of the power die leads 108 rest on top of and are in electrical contact with the first set of power die electrodes.

Also as can be seen in FIG. 2, the power die 120 has a larger footprint than the flag 102 such that a portion of the power die 120 including the first set of power die electrodes overhangs the flag 102. Then the proximal ends 112 of the power leads 108 can contact the first set of power die electrodes yet still be spaced from the flag 102. Within the space between the flag 102 and the proximal ends 112 of the power leads 108, a surface of the power die 120 is exposed, and there is a second set of power die electrodes located in this exposed space.

The control die 116, which is attached to the top surface 104 of the flag 102, preferably has a smaller footprint than the flag 102, as shown in FIG. 2. Although FIG. 2 is not necessarily drawn to scale, it shows that in the preferred embodiment, the control die 116 is smaller than the power die 120 and the flag 104. The control die 116 also has a second set of electrodes that are electrically connected to the second set of power die electrodes with second bond wires 128.

A mold compound 130 encases the flag 102, the proximal ends 112 of the power leads 108, the signal leads 110, the control die 116, the power die 120, and the first and second bond wires 118 and 128. The mold compound 130 protects the dies 116 and 120, the bond wires 118 and 128, and the wire bonds from being damaged. The mold compound 130 also defines a package body. Exposed are distal ends 114 of the power leads 108, side and bottom surfaces of the signal leads 110, and the bottom side of the power die 120. The exposed portions of the leads 108 and 110 allow for external electrical connection to the device 100.

In one embodiment, a metal coating 132, such as a layer of solder is formed over the exposed bottom surface of the power die 120. The purpose of the metal coating 132 is to prevent the bottom of power die from mechanical damage during device level electrical testing and handling, prior to surface mount.

The lead frame may be formed of copper or other conductive metals, as is known in the art, and may be supplied in either strip or array form. The lead frame or just selected portions of the lead frame, like outer lead areas of the leads, may be coated or plated with another metal or alloy to inhibit corrosion when the lead frame is exposed to the ambient environment. The lead frame may be formed from a sheet of copper or copper foil by cutting, stamping, and/or etching. In one embodiment, the die receiving area 102 comprises a die pad, that is, a solid piece of copper upon which the dies 116 and 120 are mounted. In some embodiments, the die pad may be made relatively thick so that it can act as a heat sink, absorbing heat generated by the dies 116 and 120.

The control die 116 may comprise a digital circuit that receives signals from and provides signals to other integrated circuit chips, while the power die 120 may comprise an analog circuit, such as power MOSFET. In one embodiment, the device 100 may comprise an integrated circuit that can be used, for example, to control automotive headlamps, such as an NXP eSwitch (eXtreme Switch) available from NXP B.V. of the Netherlands, which includes features such as a 16-bit SPI with daisy chain capability, a PWM module with external or internal clock, smart over-current shutdown, over-temperature protections, auto-retry on most protections, a fail-safe mode, open load detection for bulbs or LEDs, short to battery detection, and analog current and temperature feedback.

Figure 3:
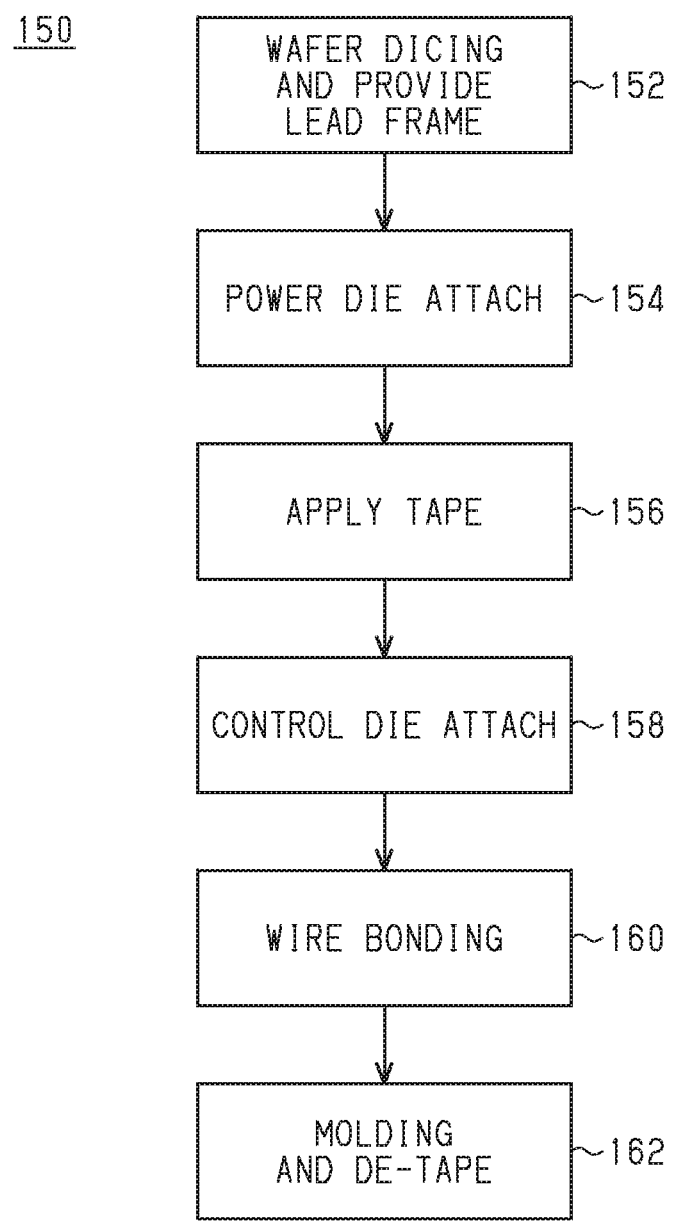
FIG. 3 is a flow chart of a process for assembling the power die package of FIG. 2.

FIG. 3 is a flow chart 150 of a method of assembling the package 10 shown in FIG. 2 and FIGS. 4-8 illustrate the package 10 in various stages of the assembly process.

Figure 4A:
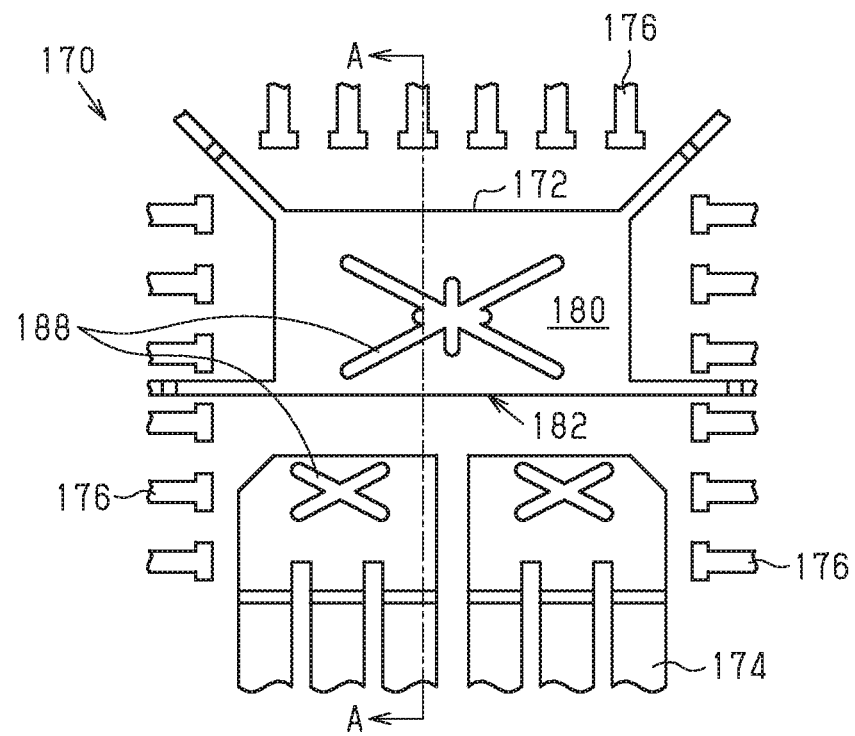
FIG. 4A is a top plan view and FIG. 4B is a side view along line A-A of FIG. 4A, of a lead frame of the power die package of FIG. 2.
Figure 4B:
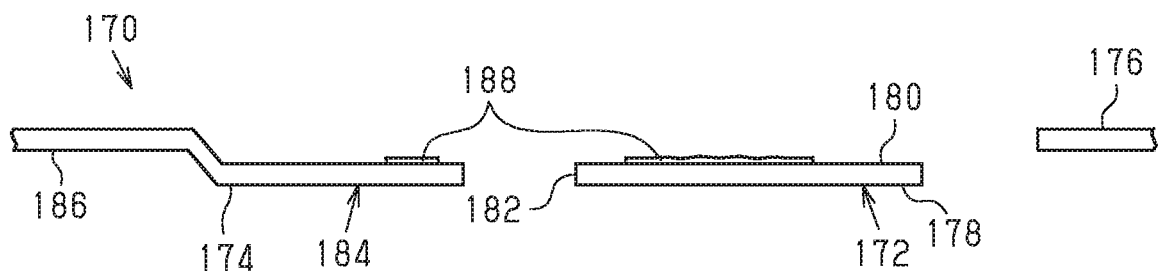

In a preliminary step 152, wafer dicing is performed to provide a plurality of power dies and a plurality of control dies. In the presently preferred embodiment, the power dies and control dies are fabricated on separate wafers, but the dicing step may be performed on both of the wafers at the same assembly site. In addition, at step 152, a lead frame like the lead frame shown 170 shown in FIGS. 4A and 4B is shown. More particularly, FIGS. 4A and 4B show a portion of a lead frame 170 in accordance with an embodiment of the present invention. The lead frame 170 is part of an array of lead frames so that multiple packages may be assembled simultaneously. The lead frame 170 includes a flag 172, a plurality of power leads 174, and a plurality of signal leads 176. The flag 172 has an upper surface 178 for receiving a control die and a lower surface 180 for receiving a power die. The power leads 174 are located adjacent to and spaced from a first lateral side 182 of the flag 172, while the signal leads 176 are adjacent to and spaced from at least one other lateral side of the flag 172. In the embodiment shown, the signal leads 176 are disposed around the remaining three lateral sides of the flag 172. The power leads 174 have proximal ends 184 near to the flag 172 and distal ends 186 spaced further from the flag 172. As can be seen in FIG. 4B, the flag 172 and the proximal ends 184 of the power leads 174 lie in a first plane and the signal leads 176 and the distal ends 186 of the power leads 174 lie in a second plane that is spaced from and parallel to the first plane. The lead frame 170 may be formed at the assembly site or formed at a by a lead frame supplier and as previously discussed, the lead frame may be plated with a metal, metals, or an alloy to prevent corrosion.

At step 154, a power die is attached to the lead frame. In the presently preferred embodiment, the lead frame 170 is turned over so that the bottom side 180 faces up, as shown in FIGS. 4A and 4B and a conductive epoxy 188 is disposed on the bottom side 180 of the flag 172 and the proximal ends 184 of the power leads 174. The conductive epoxy 188 may be dispensed onto the flag 172 and the power leads 174 in an X-pattern or as a blob or smear (no particular shape).

Figure 5A:
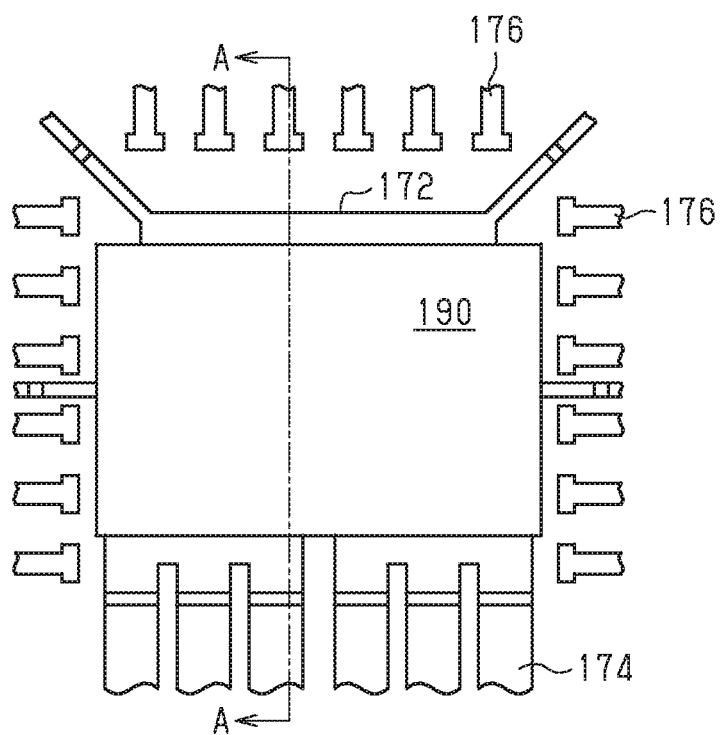
FIGS. 5A and 5B are a top plan view and a side view illustrating a power die attach step in the assembly process of FIG. 3.
Figure 5B:
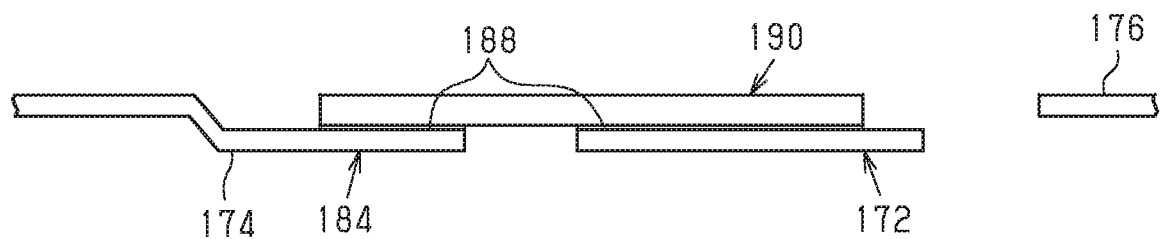

FIGS. 5A and 5B show an active side of power die 190 attached to the lower or bottom surface of the flag 172. The power die 190 has a larger footprint than the flag 172 such that a portion of the power die 190 overhangs the flag 172, and the portion of the power die 190 that overhangs the flag 172 has a plurality of power die electrodes including a first set of power die electrodes that are in contact with and electrical communication with the proximal ends 184 of the power leads 174. Thus, the power die 190 spans the space between the flag 172 and the power leads 174, and rests on both of the flag 172 and the power leads 174. Referring to FIG. 5B, although the right-hand side of the drawing shows the lateral side of the flag 172 and the lateral side of the power die 190 are not aligned, it is not a requirement that the flag 172 and the power die are not aligned. For example, if the flag 172 was less wide so that it's lateral side was aligned with the lateral side of the power die 190, then the lead frame would use less metal.

Figure 6A:
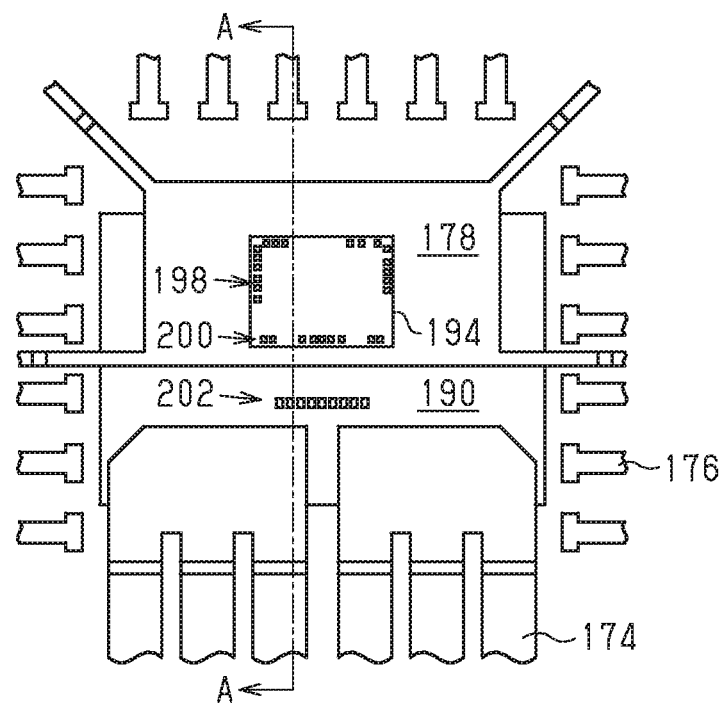
FIGS. 6A and 6B are a top plan view and a side view illustrating a control die attach step in the assembly process of FIG. 3.
Figure 6B:
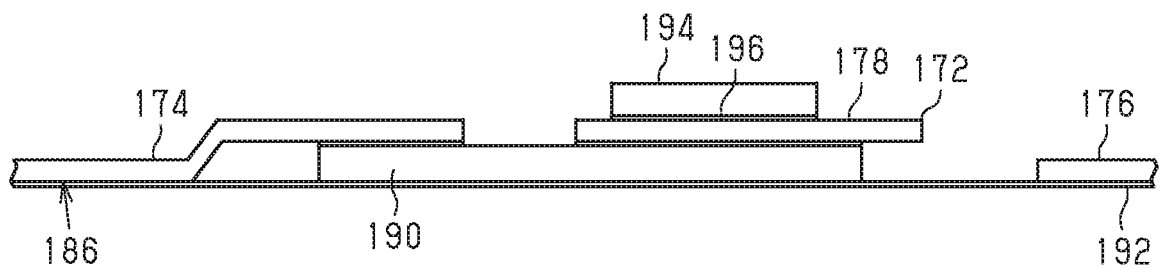

At step 156 (FIG. 3), after attaching the power die 190, a tape 192 is placed over the distal ends 186 of the power leads 174, the power die 190, and the signal leads 176, as shown in FIG. 6B. The assembly is then turned over and step 158, attaching a control die 194 is performed. As shown in FIGS. 6A and 6B, the control die 194 is attached to upper surface 178 of the flag 172 with a die attach film or die attach epoxy 196. The control die 194 is attached with its active side up so that a plurality of first electrodes 198 and a plurality of second electrodes 200 are accessible. The power die 190 also has a plurality of second electrodes 202 that are located on the power die 190 and visible in the gap between the flag 172 and the power leads 174.

Figure 7A:
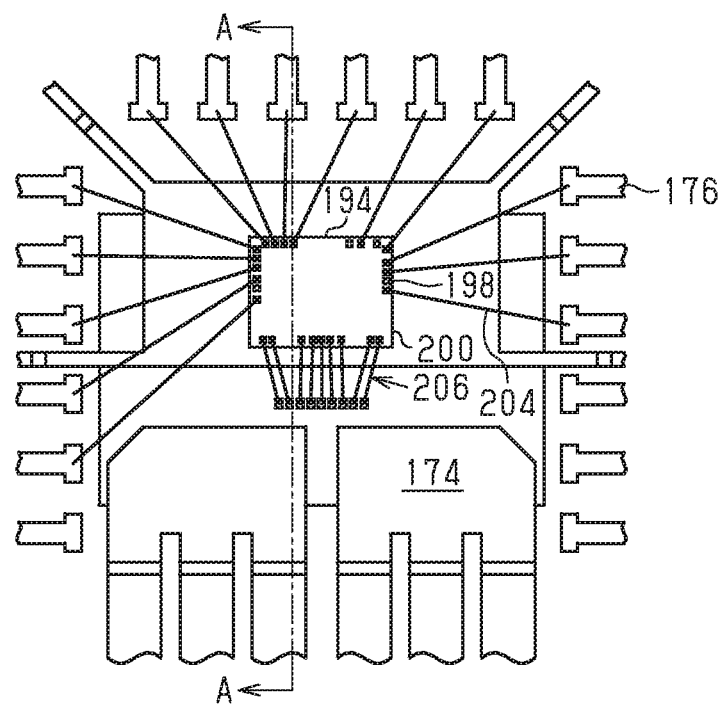
FIGS. 7A and 7B are a top plan view and a side cross-sectional view illustrating a wire bonding step in the assembly process of FIG. 3.
Figure 7B:
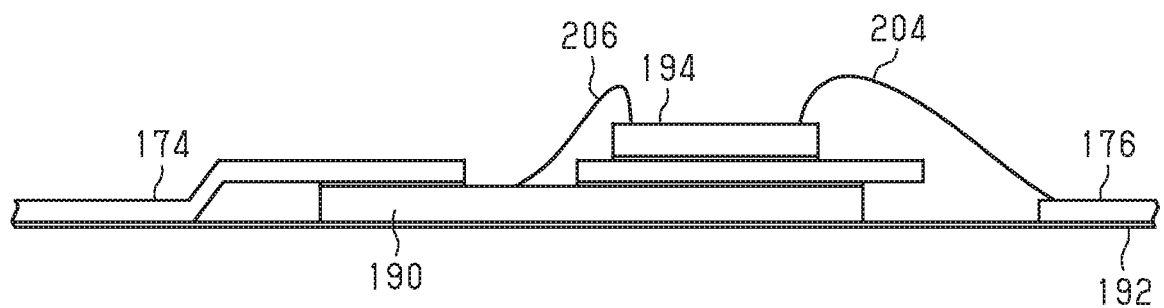

At step 160, first electrical connections are made between the first set of control die electrodes 198 and the signal leads 176, and second electrical connections are made between the second set of control die electrodes 200 and the power die 190. More particularly, as shown in FIGS. 7A and 7B, the first set of the control die electrodes 198 are electrically connected with the plurality of signal leads 176 with first bond wires 204 and the second set of control die electrodes 200 are electrically connected with the second set of power die electrodes 202 with second bond wires 206. The first and second bond wires 204 and 206 may comprise the same wire type, e.g., 1.5 mil copper wire.

Figure 8:
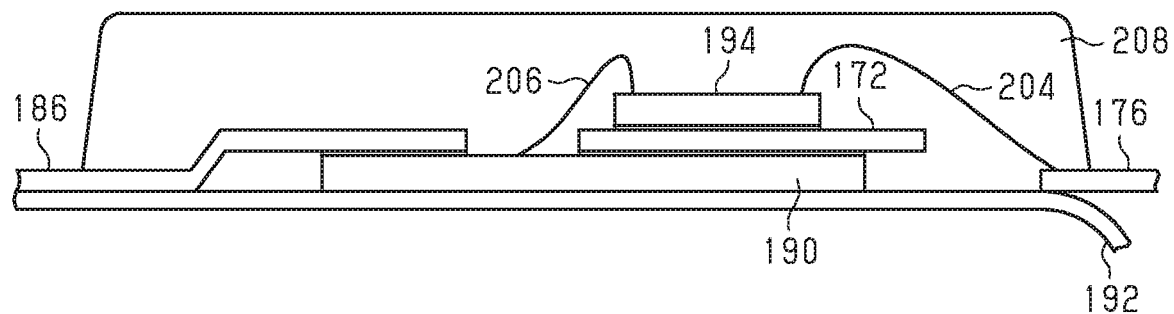
FIG. 8 is an enlarged cross-sectional side view illustrating a molding step in the assembly process of FIG. 3.

After wire bonding, at step 162 (FIG. 3), a mold compound 208 is formed over the dies 190 and 194, the first and second bond wires 204 and 206, and portions of the power leads 174 and the signal leads 176, as shown in FIG. 8. The mold compound 208 may be formed over the assembly using a "molded array packaging" or MAP process, which is known in the art. After molding, a bottom surface of the power die 190 is exposed, as are portions of the signal leads 176 and the distal ends 186 of the power leads 174. Also after molding, the tape 192 is removed.

Figure 9A:
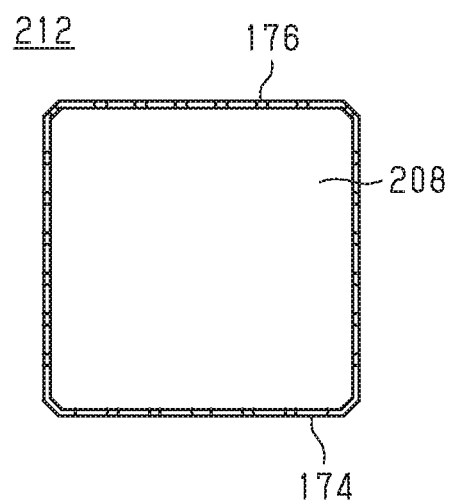
FIGS. 9A and 9b are top and bottom plan views of the power die package of FIG. 2.
Figure 9B:
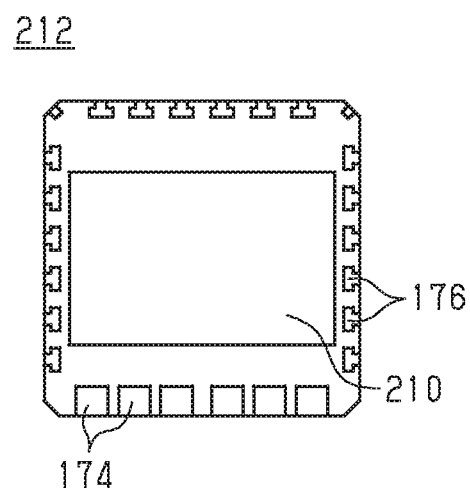

FIGS. 9A and 9B are top and bottom plan views of a power device 212 assembled in accordance with the above-described method. In the top view, FIG. 9A, portions of the power leads 174, signal leads 176 and the mold compound 208 are visible, while in the bottom view, FIG. 9B, more of the power leads 174 and signal leads 176 are visible. The bottom surface of the power die 190 also is exposed, as noted above with reference to FIG. 8. However, in some embodiments, the bottom exposed surface of the power die 190 is coated with a conductive material, such as gold or solder. In FIG. 9B, the bottom surface of the power die 190 is coated with gold 210. Trim and form operations may be performed, as needed, to complete the formation of a Quad Flag No-leads (QFN) package.

It now should be apparent that the present invention comprises a lead frame for a PQFN type package. The PQFN has a lower parts and assembly cost that present power devices because the lead frame may be formed using a punching process, which costs less than processes the require etching. Moreover, the flag and leads may have the same thickness, thus cost is not increased by having a more complicated lead frame structure. The power die is directly connected to the power leads, so there is no need for a separate wire bonding process that uses expensive thick aluminum wires. Both dies also fit onto opposing sides of the lead frame flag.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

The same applies to the term "implementation."

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

What is claimed is:

1. A power die package, comprising:
a lead frame having a flag having an upper surface for receiving a control die and a lower surface for receiving a power die, a plurality of power leads adjacent to and spaced from a first lateral side of the flag and a plurality of signal leads adjacent to and spaced from at least one other lateral side of the flag, wherein the plurality of power leads have proximal ends nearer to the flag and distal ends spaced further from the flag;
a control die having a back side attached to the upper surface of the flag and an active side opposite said back side that includes a plurality of control die electrodes, wherein a first set of the plurality of control die electrodes are electrically connected to the plurality of signal leads with first bond wires, and a second set of the plurality of control die electrodes, different from the first set of the plurality of control die electrodes, is electrically connected to a second set of the power die electrodes, different from the first set of power die electrodes, with second bond wires; and
a power die having a first side attached to the lower surface of the flag, wherein the power die has a plurality of power die electrodes including a first set of power die electrodes that are electrically connected to respective leads of the plurality of power leads.

2. The power die package of claim 1, wherein the power die has a larger footprint than the flag such that a portion of the power die including the first set of power die electrodes overhangs the flag.

3. The power die package of claim 2, wherein the first set of power die electrodes are in direct contact with the plurality of power die leads.

4. The power die package of claim 3, wherein the signal leads and the distal ends of the power die leads lie in a first plane and proximal ends of the power die leads and the flag lie in a second plane, wherein the second plane is parallel to and spaced from the first plane, such that the proximal ends of the power die leads rest on top of and are in electrical contact with the first set of power die electrodes.

5. The power die package of claim 4, wherein an active surface of the power die is attached to the lower surface of the flag with an electrically conductive epoxy and the proximal ends of the power die leads are attached to the first set of power die electrodes also with electrically conductive epoxy.

6. The power die package of claim 2, wherein the control die has a smaller footprint than the flag such that the control die is disposed within the footprint of the flag.

7. The power die package of claim 6, wherein the control die is attached to the flag with a die attach adhesive tape.

8. The power die package of claim 1, wherein the flag is rectangular, and the power leads are adjacent to the first lateral side of the flag and the signal leads are spaced around the remaining three other sides of the flag.

9. The power die package of claim 1, further comprising a mold compound that encases the flag, the proximal ends of the power leads, the signal leads, the control die, the power die, and the electrical connections between the power leads and the power die electrodes and the signal leads and the first set of the plurality of control die electrodes, wherein a bottom surface of the power die is exposed.

10. The power die package of claim 9, further comprising a layer of solder formed over the exposed bottom surface of the power die.

11. The power die package of claim 9, wherein the package comprises a quad flat no-leads (QFN) package.

12. The power die package of claim 9, wherein:
the first set of the plurality of control die electrodes are electrically connected to the plurality of signal leads with first bond wires;
a second set of the plurality of control die electrodes, different from the first set of the plurality of control die electrodes, is electrically connected to a second set of the power die electrodes, different from the first set of power die electrodes, with second bond wires;
the power die has a larger footprint than the flag such that a portion of the power die including the first set of power die electrodes overhangs the flag;
the first set of power die electrodes are in direct contact with the plurality of power die leads;
the signal leads and the distal ends of the power die leads lie in a first plane and proximal ends of the power die leads and the flag lie in a second plane, wherein the second plane is parallel to and spaced from the first plane, such that the proximal ends of the power die leads rest on top of and are in electrical contact with the first set of power die electrodes;
an active surface of the power die is attached to the lower surface of the flag with a conductive epoxy and the proximal ends of the power die leads are attached to the first set of power die electrodes also with conductive epoxy;
the control die has a smaller footprint than the flag such that the control die is disposed within the footprint of the flag; and
the control die is attached to the flag with a die attach adhesive tape.

13. A method of assembling a power die package, comprising:
providing a lead frame including a flag having an upper surface for receiving a control die and a lower surface for receiving a power die, a plurality of power leads adjacent to and spaced from a first lateral side of the flag and a plurality of signal leads adjacent to and spaced from at least one other lateral side of the flag, wherein the power leads have proximal ends nearer to the flag and distal ends spaced further from the flag;
attaching an active side of a power die to the lower surface of the flag, wherein the power die has a larger footprint than the flag such that a portion of the power die overhangs the flag, and wherein the portion of the power die that overhangs the flag has a plurality of power die electrodes including a first set of power die electrodes that are in contact with and electrical communication with the proximal ends of the power leads;
attaching a back side of a control die to the upper surface of the flag, wherein an active side of the control die opposite said back side of the flag includes a plurality of control die electrodes;

electrically connecting a first set of the plurality of control die electrodes with the plurality of signal leads with first bond wires;

encasing the flag, the proximal ends of the power leads, the signal leads, the control die, the power die, the electrical connections between the power leads and the first set of power die electrodes, and the first bond wires with a mold compound, wherein a bottom surface of the power die is exposed.

14. The method of claim 13, further comprising forming a layer of solder over the exposed bottom surface of the power die.

15. The method of claim 13, further comprising electrically connecting a second set of the plurality of control die electrodes with a second set of the power die electrodes with second bond wires.

16. The method of claim 13, further comprising performing a trim and form step on exposed portions of the power leads and the signal leads to form a Quad Flat No-leads (QFN) package.

17. The method of claim 13, wherein the signal leads and the distal ends of the power die leads lie in a first plane and proximal ends of the power die leads and the flag lie in a second plane, wherein the second plane is parallel to and spaced from the first plane, such that the proximal ends of the power die leads rest on top of and are in electrical contact with the first set of power die electrodes.

18. The method of claim 13, wherein the power die is attached to the flag with an electrically conductive epoxy and the control die is attached to the flag with a non-conductive die attach adhesive.

19. A power die package, comprising:
a lead frame having a flag having an upper surface for receiving a control die and a lower surface for receiving a power die, a plurality of power leads adjacent to and spaced from a first lateral side of the flag and a plurality of signal leads adjacent to and spaced from at least one other lateral side of the flag, wherein the plurality of power leads have proximal ends nearer to the flag and distal ends spaced further from the flag;

a control die having a back side attached to the upper surface of the flag and an active side opposite said back side that includes a plurality of control die electrodes, wherein a first set of the plurality of control die electrodes are electrically connected to the plurality of signal leads with first bond wires; and a power die having a first side attached to the lower surface of the flag, wherein the power die has a plurality of power die electrodes including a first set of power die electrodes that are electrically connected to respective leads of the plurality of power leads, and wherein the power die has a larger footprint than the flag such that a portion of the power die including the first set of power die electrodes overhangs the flag.

20. The power die package of claim 19, wherein the first set of power die electrodes are in direct contact with the plurality of power die leads.

* * * * *